United States Patent [19]
Brummette et al.

[11] Patent Number: 5,371,552
[45] Date of Patent: Dec. 6, 1994

[54] CLAMPING CIRCUIT WITH OFFSET COMPENSATION FOR ANALOG-TO-DIGITAL CONVERTERS

[75] Inventors: Steven C. Brummette; William G. Miller, both of Knoxville; James F. Asbury, Memphis, all of Tenn.; William R. Krenik, Garland; Norman L. Culp, Plano, both of Tex.

[73] Assignees: North American Philips Corporation, New York, N.Y.; Texas Instruments Inc., Dallas, Tex.

[21] Appl. No.: 785,737

[22] Filed: Oct. 31, 1991

[51] Int. Cl.5 .............................................. H04N 5/18
[52] U.S. Cl. ..................... 348/697; 348/692; 341/118
[58] Field of Search ................. 358/172, 171, 184, 33, 358/34; 341/120, 118; 348/707, 691, 692, 694, 695, 696, 697; H04N 5/18

[56] References Cited
U.S. PATENT DOCUMENTS

| | | | |
|---|---|---|---|
| 4,562,471 | 12/1985 | Eouzan et al. | 358/172 |
| 4,573,188 | 2/1986 | Lewinter | 341/118 |
| 4,651,213 | 3/1987 | Takimoto | 358/172 |
| 4,663,654 | 5/1987 | Morrison | 358/33 |
| 4,859,871 | 8/1989 | Kobayashi et al. | 358/34 |
| 4,970,594 | 11/1990 | Kitaura et al. | 358/172 |
| 4,982,191 | 1/1991 | Ohta | 341/118 |
| 5,057,920 | 10/1991 | Wilkinson | 358/172 |
| 5,084,700 | 1/1992 | Christopher | 358/172 |
| 5,105,276 | 4/1992 | Schrock | 358/171 |

FOREIGN PATENT DOCUMENTS

| | | | |
|---|---|---|---|
| 0178044 | 4/1986 | European Pat. Off. | |
| 0164381 | 7/1987 | Japan | H04N 5/18 |
| 0023778 | 1/1991 | Japan | H04N 5/18 |

Primary Examiner—James J. Groody
Assistant Examiner—Jeffrey S. Murrell
Attorney, Agent, or Firm—Edward W. Goodman

[57] ABSTRACT

A clamp circuit including a clamping capacitor and a differential amplifier charge and discharge the clamping capacitor in accordance with the magnitude of difference signals applied to the differential amplifier's inverting and non-inverting inputs. The inverting input receives the voltage produced by the clamping capacitor. This voltage is digitized by an analog-to-digital converter (ADC) and is set to a reference voltage range by a voltage divider network. The ADC output signal is compared to a given reference level corresponding to a selected voltage in the reference voltage range to produce a difference output signal. This difference output signal is summed with the selected voltage in the reference voltage range and applied to the non-inverting input of the differential amplifier to produce a clamp voltage with substantially minimum offsets due to the amplifier, ADC and DAC. A clamp enable signal operates the clamping circuit during a blanking interval of a video signal applied to the clamping capacitor. A digital processing circuit of a television receiver receives the video signal clamped to the level of the clamp voltage. Instead of processing the video signal at the clamped level, a blanking signal code word is inserted in the clamped video signal to save memory. The video signal applied to the digital processing circuit is thus clamped to the voltage level by the inserted code word.

19 Claims, 3 Drawing Sheets 5,371,552

CLAMPING CIRCUIT WITH OFFSET COMPENSATION FOR ANALOG-TO-DIGITAL CONVERTERS

FIELD OF THE INVENTION

This invention relates to a clamping circuit, and more particularly, to a clamping circuit for producing a digital signal having a given reference value corrected for offset errors in the clamping circuit.

BACKGROUND OF THE INVENTION

Clamping circuits respectively charge a capacitor to modify the DC component of an applied signal to a reference voltage level. An input AC signal applied to the capacitor is DC offset by that charged voltage level. The capacitor may be charged by a differential amplifier which compares the charge level of the capacitor to a reference, the amplifier charging and discharging the capacitor to maintain the desired voltage. This referred to as a feedback clamp.

One application for a feedback clamp is in a digital television color receiver. In one kind of receiver the clamping capacitor receives a composite video signal which is to be clamped to a blanking signal level. The clamped video signal is then applied to an analog-to-digital converter (ADC) for digitizing the video signal. The analog-to-digital converter receives reference voltages of different values in a given range one of which values corresponds to desired level for the composite video signal blanking level. A differential amplifier compares the voltage level of the clamping capacitor charge to a reference voltage value corresponding to the ADC reference value for charging or discharging the capacitor accordingly. A clamp enable pulse is applied to the differential amplifier for causing the clamp to operate during the blanking interval so as to not interfere with the active, that is, the AC, video portion of the video signal. The resulting digitized output signal is applied to a digital signal processor which separates the synchronization, luminance and chrominance signals from the composite video signal in addition to other processing functions.

Other feedback clamping circuits are used in other portions of a color television receiver, for example, in the RGB processor, to clamp the signals to desired levels. If these signals are not referenced to a designated DC level, then the resultant color picture will be inaccurate. This is manifested most prominently when it is desired to use the color circuitry for displaying a black and white picture. Different offset values of the input color difference signals, if not clamped to a given reference level, when processed for purposes of obtaining a black and white picture, will result in the RGB processor interpreting the different DC levels of the resulting black and white video signals as manifesting color components. These color components appear as color hues on the black and white picture, are noticeable and undesirable.

A television picture comprises 525 raster scan lines forming a frame comprising a pair of successively generated fields, each field comprising 262.5 scan lines. The fields are interlaced in successive time intervals. A problem observed with such interlacing is that the successive interlacing of the adjacent fields, even though the lines are closely spaced to one another and interlaced in relatively short time periods, creates a condition referred to as interline flicker which may be observable in the picture.

A digital television receiver can correct for this problem. In a digital television receiver, the video signal comprising luminance and chrominance signals are processed and stored in memory. The system using an algorithm predicts the content of the video signals of each succeeding field based on information in the preceding field which is digitally stored in memory. The predicted field is also stored in memory. The predicted field is superimposed simultaneously with the proceeding occurring actual field to produce a frame without successively occurring fields as occurs in an analog receiver. That is, the 525 scan lines for each frame are generated in successive order as if occurring in a common field.

In order to perform this kind of processing, among other processing, the video information signal is stored in memory and then subsequently processed for a given design purpose. It is essential to clamp each of the luminance and chrominance signals to a reference level throughout the signal processing procedure.

In a second kind of digital color television receiver, a tuner IF circuit is included which provides a composite superheterodyne video signal to a synchronization (sync), luminance (luma) and chrominance (chrome) processing circuit. The sync, luma and chroma processing circuit separates the Y (luminance) and the U/V (color difference) signals and the horizontal and vertical synchronization signals from the composite video signal. The latter signals are applied to scan circuits for deriving horizontal and vertical drive signals for the cathode ray tube (the picture tube). The separated Y, U and V signals are applied through appropriate clamps to a digital processor. Separate clamps are provided to insure the digitized luma and color difference signals are at a desired blanking level prior to digital processing as compared to the first kind of receiver discussed above in which the composite signal is clamped by a common clamp prior to digital processing.

The clamps include analog-to-digital converters (ADC) for digitizing the analog video signal prior to being applied to the digital processor. The blanking portion comprises a relatively large portion of the video signal. Since the blanking portion is at a relatively DC level, it is desired to conserve digital processor memory by eliminating the digital processing of the digitized blanking portion in the second receiver type. The assumption is that the voltage level of the blanking portion is constant and, for each of the luminance and chrominance signals, has a known value. To conserve memory, the value of the blanking portion is inserted by the digital processor. For example, the processor includes a code word generator for generating a digital code word manifesting the value of the blanking level of each of the luma and color difference signals. In so doing, it is assumed that the video signal outputs of the analog-to-digital converters of each of the feedback clamping circuits will correspond to a given desired blanking level by reason of the fact that the clamps are set to provide for these levels. These levels are intended to be substantially identical to the reference levels represented by the code words provided by the digital processor. The digital processor inserts the code word corresponding to the desired blanking portion of the applied video signals during their blanking portion intervals.

In order to provide appropriate digital codes corresponding to their video signals, the analog-to-digital converters divide the voltage levels thereof to manifest a typical video range, for example, 256 levels. Assuming further that the ADCs have a 2 volt range, for example, 2.5 to 4.5 volts with a 3.5 volt mid range, then the ADCs have a sensitivity of about 7.8 millivolts per grey scale step. As a result, a 0.1 volt or even 0.01 volt error in the clamping circuit or in the ADC is significant relative to the sensitivity of the ADC.

The present inventors recognize that when the digital processor inserts a code word manifesting a blanking DC voltage level into the digitized video signal that code word represents a predetermined voltage level for example 3.5 volts. If the clamping circuits have an offset error of 0.1 volts, or possibly even 0.01 volts, the resulting video signal will also be offset by that amount. However, because the digital processor inserts an assumed blanking voltage value into the received digitized video signal, the video signal being clamped to the clamping level, will be offset by the error thereof relative to the blanking signal level introducing a distortion in the resulting signals and, therefore, colors of the picture.

One source of error is due to an offset in a typical ADC due, for example, to changes in temperature. Further, a differential amplifier employed in the analog loop of the clamping circuit may also introduce an offset error so that the resulting clamping level is not at the desired level.

SUMMARY OF THE INVENTION

The present invention is a recognition of and solution of these problems. A clamping circuit for clamping a received signal to a reference level according to one embodiment of the present invention comprises means responsive to the received signal for generating a digital output clamping voltage including charge storage means and analog-to-digital converter means for shifting the value of the received signal to the level of the output clamping voltage. The output voltage level tends to be offset from a given level by offset errors in at least the analog-to-digital converter means. Error voltage generating means are provided for correcting the output voltage level to substantially correspond to the given level.

In accordance with a further embodiment of the present invention the error voltage generator means comprises comparator means responsive to the digital output voltage and a reference voltage manifesting the given level to provide an error voltage. Means are responsive to the error voltage for correcting the value of the clamping voltage.

In accordance with a still further embodiment of the present invention, the charging means comprises a capacitor and the error voltage generator means comprises a relatively high gain differential amplifier having inverting and non-inverting inputs and low pass filter means between the capacitor and the amplifier. The filter means are coupled to the inverting input of the amplifier. The correction means comprises means for supplying the analog-to-digital converter with a plurality of reference voltages. The comparator means compares the digital output signal of the analog-to-digital converter to a reference signal to generate an error signal. Digital-to-analog converter means convert the error signal to an analog error signal. Means are provided for summing the analog error signal to a selected one of a plurality of analog-to-digital converter reference voltages and for applying the summed signal to the non-inverting input of the differential amplifier.

DESCRIPTION OF THE PREFERRED EMBODIMENTS

Figure 1:
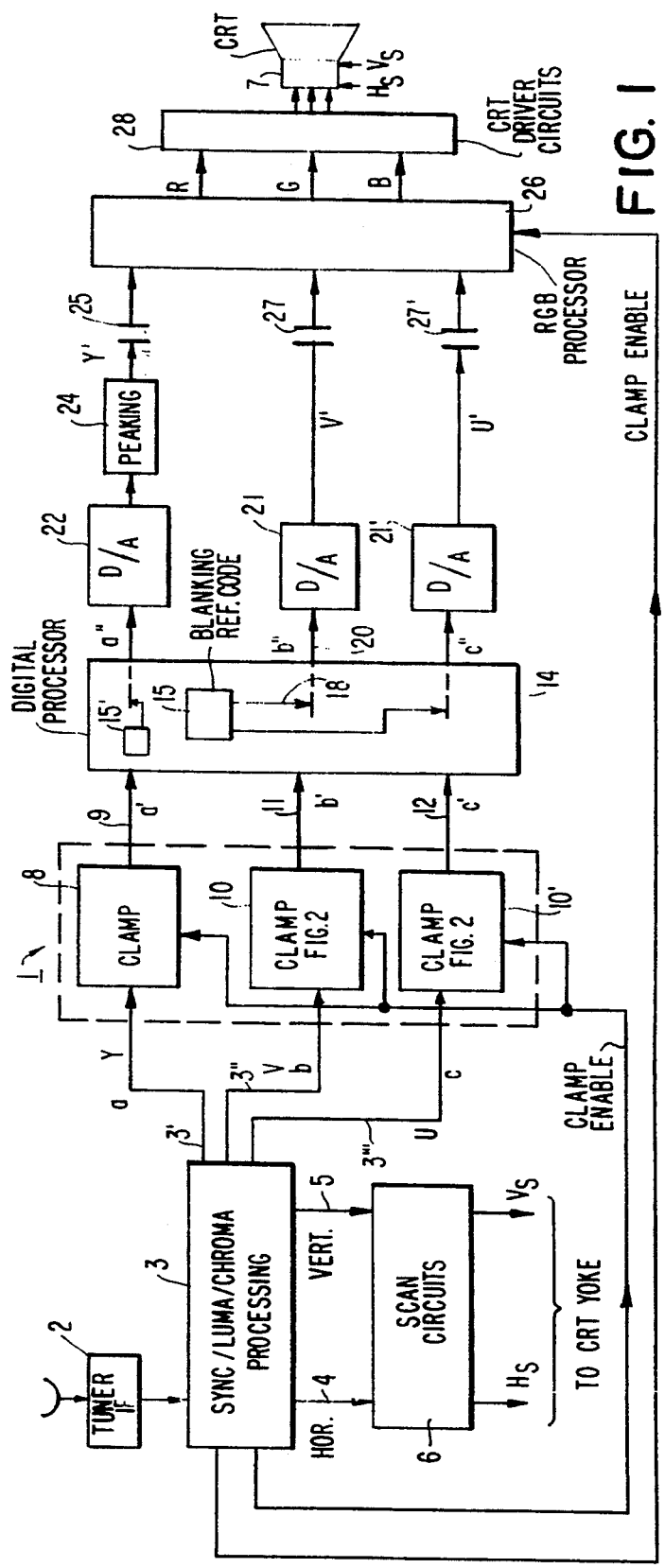
FIG. 1 is a schematic circuit diagram of one embodiment of the present invention employed in a digital color television receiver.

In FIG. 1, circuit 1 includes a tuner IF circuit 2 for tuning a video signal received via an antenna or the like to a given frequency and for superheterodyning the tuned signal in accordance with known procedures. The tuner IF circuit 2 does not form any part of the present invention. The so processed received video signal is applied to a sync/lumina/chroma processing circuit 3. The processing circuit 3 provides a Y luminance output signal a on output line 3', a V color difference signal b on output line 3" and a U color difference signal c on output line 3'''. In addition, the processing circuit 3 provides on output line 4 horizontal related synchronization information signals and on output line 5 vertical related synchronization information signals applying these signals to scan circuits 6. The scan circuits 6 process the signals on lines 4 and 5 producing CRT (picture tube) horizontal and vertical drive signals $H_s$ and $V_s$ respectively. These signals are applied to the yoke of the CRT 7. These signals cause the raster scan lines to be scanned in a known way.

The luminance signal a from the processing circuit 3 is applied to clamp 8 for providing a digitized video output signal a' on line 9 referenced to a given blanking clamp level established by clamp 8. Clamp 10 processes the color difference signal b on input line 3" to produce a digitized video output signal on line 11 referenced to a given clamp level established by clamp 10. The clamp 10', which is identical to clamp 10, receives the color difference signal c on input line 3''' to produce a digitized video output signal on line 12 referenced to a given clamp level established by clamp 10', the clamp levels of clamps 10 and 10' being the same. Clamp 8 differs from clamps 10 and 10' in that the clamp 8 provides a blanking signal level that differs from the blanking signal levels of clamps 10 and 10' based on the requirement that the luminance blanking signal portion has a relatively low level as compared to a higher mid level of the color difference signals relative to a given range of values. Otherwise, the clamps are the same in construction.

The digitized video output signals a', b' and c' of respective clamps 8, 10 and 10' are applied to digital processor 14. Digital processor 14 includes memory (not shown) and computer programs (not shown) for processing the received digitized video signals for superimposing a predicted field over an active field to produce a single frame of successively generated scan lines among other functions not relevant to the present description. To perform the digital processing, the processor 14 includes digital memory for storing the various digital signals including the predicted fields as discussed above. In order to conserve memory space, the digital processor does not process the blanking portion of each of the received video signals on lines 9, 11 and 12. Processor 14, instead, assumes that the digitized output signals of clamps 8, 10 and 10' have been digitized to a given clamped reference level so that the blanking portion thereof corresponds to that assumed DC level.

The digital processor 14 includes a blanking signal reference code generator 15 which generates a color difference blanking mid range level code word, e.g., 10000000, a high level being represented by a code word comprising all ones and a low level being represented by a code word comprising all zeros by way of example. Blanking signal reference generator 15' generates a luminance blanking signal which is at a relatively low level not necessarily at all zeros.

Figure 3:
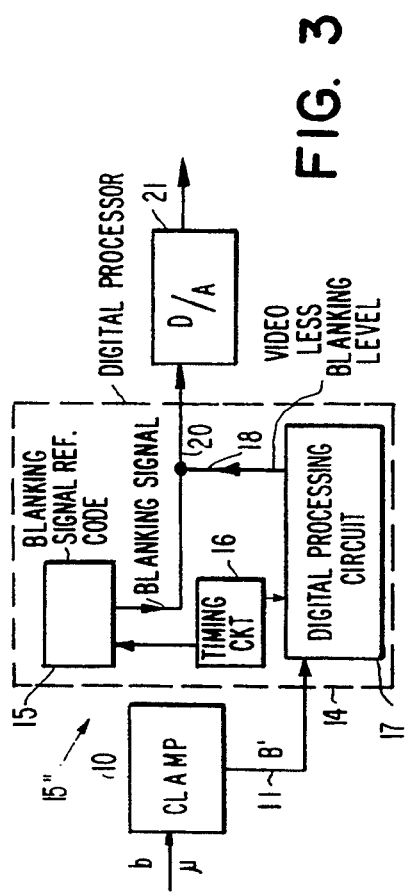
FIG. 3 is a schematic circuit diagram of a circuit for inserting a blanking signal reference code in the digital processor of FIG. 1.

In FIG. 3, representative circuit 15" for generating a color difference code word is illustrated. The digitized video signal b' on line 11 is applied to the digital processing circuit 17 of digital processor 14. Digital processing circuit 17 includes memory (not shown) for processing the video signal applied thereto in a manner discussed above. Circuit 17 produces on output 18 a digital color difference video signal without a blanking level signal. A timing circuit 16 causes the generator 15 to insert the blanking signal code word e.g., 10000000, into the digital video signal at the appropriate blanking interval to produce a video signal with the inserted blanking signal on line 20. This video signal is applied to a digital-to-analog converter 21 external to the processor 14. The generator 15' is constructed and operates in a similar manner except it inserts a low level blanking code word.

Luminance signal a" is outputted from the digital processor 14 and applied to digital to analog converter 22. The color difference signals b" and c" are outputted by the digital processor 14 to respective digital-to-analog converters 21 and 21'. The converters 22, 21 and 21' may be identical. The blanking level of the signals a", b" and c" as inserted by processor 14 closely matches the clamped levels of the active AC video portion of video signals a', b' and c' outputted by clamps 8, 10 and 10'. This is because any offset errors in the circuit feedback or other elements of the clamps are corrected by the clamps so that the clamped levels substantially correspond to the code word values inserted by the processor 14 as will be explained below.

The analog output Y' luminance signal of converter 22 is applied to a peaking circuit 24 and from there to RGB processor 26 via coupling capacitor 25. The RGB processor is a conventional circuit that includes internal thereof (not shown) additional clamping circuits for clamping the various video signals in a known way. The V color difference signal b" is processed by digital-to-analog converter 21 to produce color difference signal V' which is applied to the RGB processor via coupling capacitor 27. The U color difference signal c" is similarly processed as an analog output of digital-to-analog converter 21' applying signal U' to RGB processor 26 via coupling capacitor 27'. The RGB output signals of the RGB processor are applied to the CRT driver circuits 28 which generates the drive signals for driving the CRT 7, it being recalled that the horizontal and vertical scan line signals $H_s$ and $V_s$ are applied by the scan circuits 6.

Because the blanking portion of the video signals outputted by the clamps 8 and 10' are not processed by processor 14 and are provided instead by the code generators 15 and 15' in the digital processor 14, it is therefore critical that the code words provided by generators 15 and 15' match, to a high degree of accuracy, to the clamped levels of the video signals on input lines 9, 11 and 12 to the processor 14.

Figure 2:
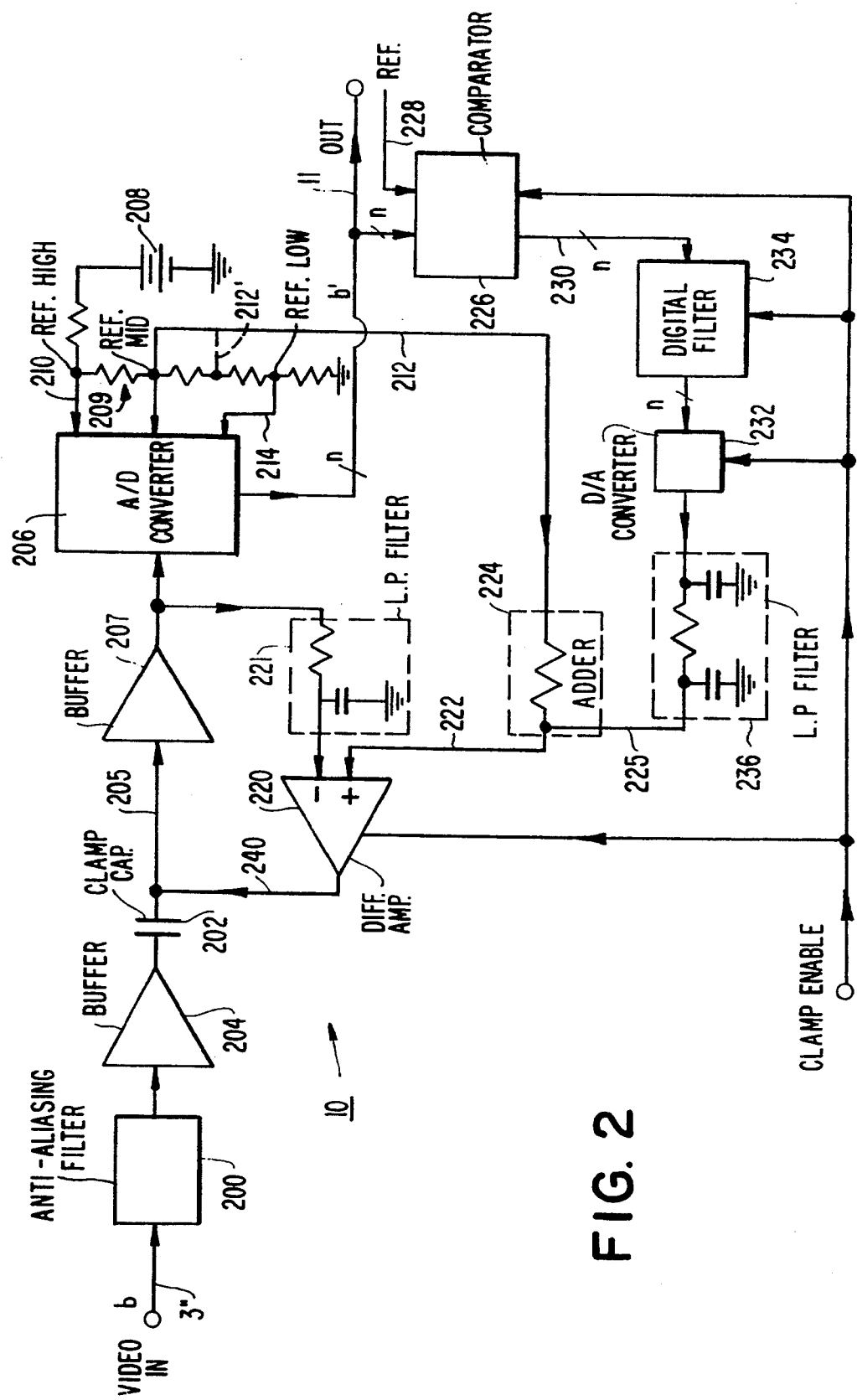
FIG. 2 is a representative embodiment of a clamp employed in the embodiment of FIG. 1.

In FIG. 2, representative clamp 10 will be described. Clamp 8 of FIG. 1 differs from the clamp 10 of FIG. 2 in that clamp 8 clamps at a lower voltage level than clamp 10, e.g., 2.69 volts as compared to 3.5 volts. The clamp 10 comprises an anti-aliasing filter 200. The anti-aliasing filter 200 assures that the output video signal thereof has a frequency value which is less than the Nyquist sampling frequency of ADC 206 in clamp 10 to preclude generating aliases or ghosts The video input signal b on line 3" processed by the filter 200 is applied to clamping capacitor 202 via a buffer 204. Clamping capacitor 202 blocks the DC portion of the video input signal b and passes the AC portion of the video thereof to line 205. The line 205 is coupled to the input of ADC 206 via a buffer 207.

Battery 208 applies a reference voltage to a resistor ladder network 209 coupled to ground to provide a reference high voltage on line 210, a reference mid voltage on line 212 and a reference low voltage on line 214 to the ADC 206. The reference high voltage may be 4.5 volts, the reference low voltage may be 2.5 volts and the reference mid level voltage may be 3.5 volts. The ADC 206 provides an output code on output line 11, a code word of all 1's in an eight bit code word corresponding to the reference high value or 4.5 volts. A code word 10000000 represents the mid level voltage, e.g., 3.5 volts, and a code word of all zeros represents a low level voltage, e.g. 2.5 volts. The code words actually appearing on output line 11 may have any one of 256 different values depending on the video signal applied thereto. Therefore each code word on the output 216 of converter 206 represents a 7.8 millivolt range of a given video level. It is known, however, that an ADC such as ADC 206 can produce an offset in the output signal on output line 11 that can vary on the order of several least significant bits in response to temperature changes, for example. This represents a significant error in the digitized value of the active AC video portion of the video signal applied to processor 14 relative to the value of the code word inserted for the blanking portion of this video signal by the processor 14.

Figure 4:
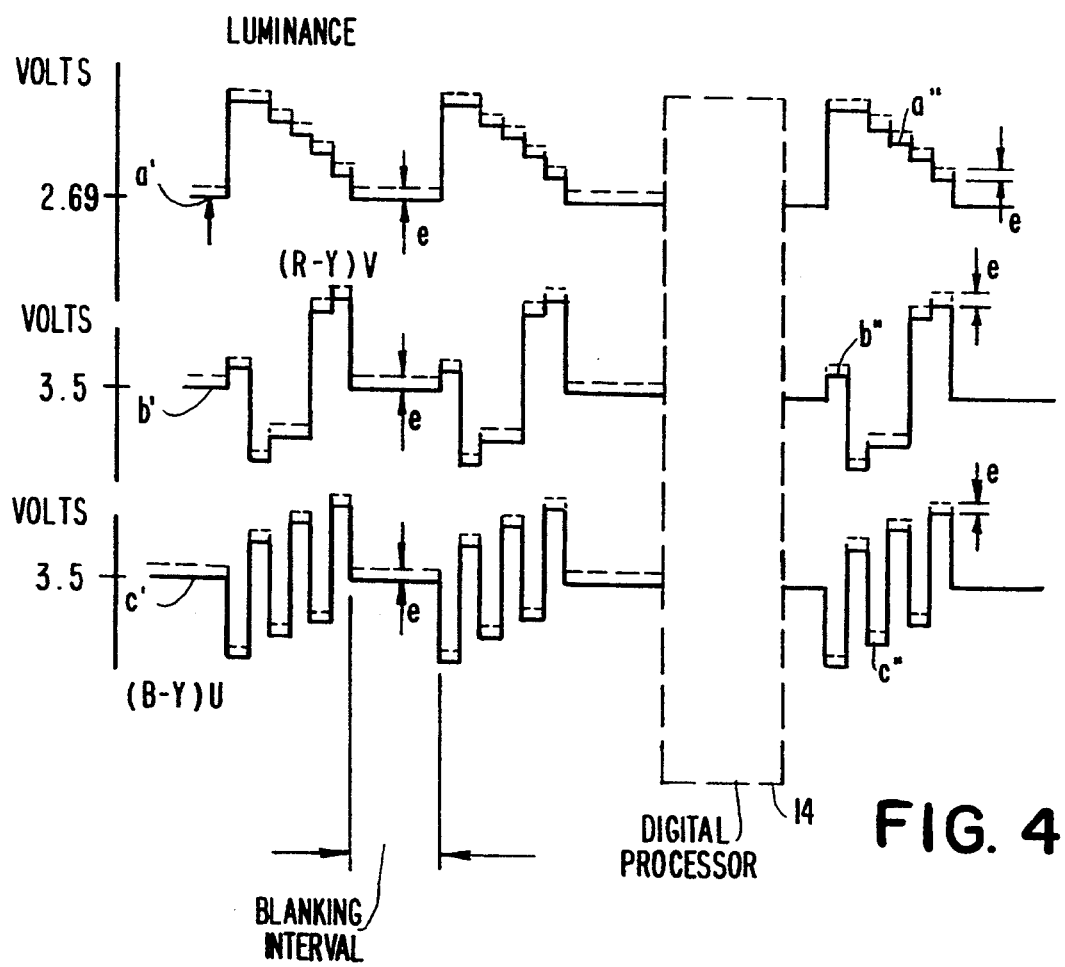
FIG. 4 illustrates different portions of video signals employed in the embodiment of FIG. 1 to illustrate certain principles of the present invention.

For example, in FIG. 4 signal b' shown in solid line is the V color difference signal outputted by clamp 10. Signal a' in solid line is the luminance signal Y outputted by clamp 8 and signal c' in solid is the color difference signal U outputted by clamp 10'. These signals are applied to the digital processor 14. Assume these digitized signals were generated by a prior art clamp with offset error introduced by way of example by the ADC. Such signals are shown in phantom in FIG. 4. The offset error introduced by such a prior art clamp, manifested for example by the error introduced by the ADC, is shown by distance e. Note that the active video and the blanking portions are both offset by error distance e by the prior art ADC. However, the processor 14 does not process the blanking portion but inserts an assumed blanking value.

To the right of the processor 14 of FIG. 4 in solid line is shown the different signals with the blanking portion inserted by the digital code words of the processor 14 code word generators 15 and 15'. The active video portions of the different signals clamped by the clamp of the present invention are also shown in solid line. The active video portions of the video signals clamped with a prior art clamp are shown in phantom. As seen in the FIG., the active video signals of the prior art clamp are offset a distance e relative to the blanking portion level. However, the blanking portions of the video signals as inserted by the processor 14 are at the assumed blanking level of the video signals without offset error distance e. Therefore, a relative offset error distance e is introduced between the active video and the blanking portion of the signals supplied to the RGB processor.

It is thus critically important that each of the clamps 8, 10 and 10' correct for such offsets including offset produced by other elements of the clamps so that the video signals on output lines 9, 11 and 12 in FIG. 1 correspond as close as possible to the level represented by the code words generated by generators 15 and 15' so as, for example, to substantially eliminate color hues in a black and white picture. It should be understood that reference to the analog-to-digital converter offset value includes reference to other offsets introduced by other circuit elements in the clamp. Offset of the luminance signal a" in FIG. 4 is interpreted by the RGB processor 26 as a different color than that intended. This difference in value illustrated by the waveforms in FIG. 4 is shown in phantom at the output of the digital processor 14.

Figure 5:
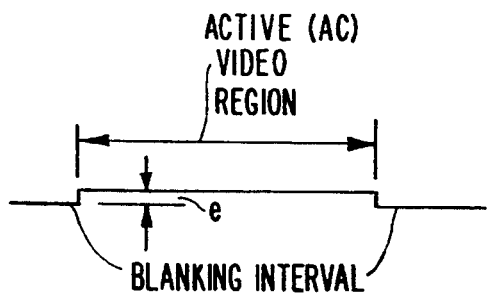
FIG.5 is a waveform diagram for further illustrating certain principles of the present invention.

In FIG. 5, the significant effects of the offset created by prior art clamps on a black and white picture is illustrated. The blanking interval has a voltage level as inserted by processor 14. Offset voltage error e is created in the active video signal region by a prior art clamp. The clamp sets this region to a DC level which is offset from the blanking portion inserted by the processor 14. The different level in the active region is interpreted by the RGB processor as a color signal and produces a color signal in the resulting black and white raster scan display.

In FIG. 2, clamping capacitor 202 is charged by a current produced by differential amplifier 220, which may be a CMOS device having high gain. In the alternative, the amplifier may comprise bipolar, gallium arsenide or other device structures according to a given implementation. That is, the circuit of FIG. 2 is process independent. The amplifier receives at its inverting input the output of buffer of 207 applied to a low pass filter 221. The non-inverting input of amplifier 220 receives a signal inputted on line 222. One portion of the signal on line 222, in the case of clamp 10, is the reference mid voltage that appears on input 212 of the ADC 206 via adder 224. A second input to adder 224 is provided by the signal on line 225. The signal on line 225 is derived as follows:

The digital output signal on output line 11 of the converter ADC 206 is the digitized analog signal appearing on the input to converter 206 from buffer 207. The digitized output signal is applied as one input to a comparator 226. A second input of comparator 226 is a reference signal on line 228. The reference signal on line 228 is a digital code word, e.g., an eight bit word, which manifests the actual value desired, i.e., reference level, for the converter 206 output signal on line 11. For example, assume it is desired the output signal of the converter 206 on line 11 has a mid range value of 10000000, as desired for signals b' and c'. It is possible that that mid range code word generated by converter 206 on output line 216 is different from code 10000000 due to an internal offset of the converter 206. The code word appearing on line 228 has a predetermined reference value and in this example is the code word for the reference value code 10000000. This code word reference value is one that is used for clamps 10 and 10'. The reference value for the clamp 8, because it is a luminous signal and is desired to create a blanking signal having a low value, is assigned a code word near 0000000, e.g. 00011000, which corresponds to a value of 2.69 volts.

The comparator 226 compares the value of the code word on line 228 to the output signal on line 11. In a first embodiment, comparator 226 produces on output line 230 an eight bit digital code word signal manifesting the difference in values between the output of converter 206 on line 11 and the reference signal on line 228. The resulting code word difference signal on line 230 is applied to digital-to-analog converter (DAC) 232 via digital filter 234, which may be a low-pass filter. The value of the resulting code word then causes the DAC 232 to output a corresponding charge or discharge current to the capacitors of filter 236. The magnitude of the charge current amplitude corresponds to a given difference code word value. The filter 234 removes undesirable noise from the difference signal on line 230. Either the comparator 226 or the digital filter 234 may include signal gain to set the digital feedback loop gain. Digital-to-analog converter 232 applies an analog signal corresponding to the digital input signal from line 230 to line 225 via low-pass filter 236. Low-pass filter 236 removes unwanted high frequency components from the resulting analog signal. This resulting analog signal is added by adder 224 to the reference voltage signal provided on line 212 by the battery 208 and resistor network 209. The signal on line 212 for clamp 10 (and 10') is Ref Mid or 3.5 volts, for example. In the case of clamp 8, the line 212 is connected as line 212' (shown dashed) to provide the reference low value near 0000000 or 2.69 volts as mentioned above. To do this line 212' is connected to a different point of the resistor network 209 as shown closer to ground potential than line 212. The added signals are applied to the non-inverting input of the differential amplifier 220.

In the above described first embodiment, the clamp 10 provides a voltage at the input to the ADC 206 during clamp enable periods. This voltage generally corresponds to a certain desired voltage level manifested by the code word at the ADC output line 11. In this case, assuming an ADC range of 2.5 to 4.5 volts divided into 256 increments, or 7.8 millivolts per step, the voltage at the ADC 206 input would lie in a range of 7.8 millivolts. Thus, this analog input voltage would have a 7.8 millivolt ambiguity associated with it. As long as the ADC input voltage remains within the range associated with a desired code word, no changes in the input voltage value would be implemented by the circuit.

In a second embodiment, the clamp is constructed to set the voltage at the ADC 206 input to a level corresponding to a code word transition. This provides a smaller range to the analog voltage. For example in the luminance channel the ADC 206 input may be clamped to the code transition value between decimal 23 and 24 or binary 00010111 and 00011000. In the color difference channels, the code transition may be decimal 128 to 129 or binary 10000000 to 10000001. To do this, the comparator 226 output is one bit wide. This is a sign bit which has a binary one value if the code word input to the comparator is below the desired code value and has a binary zero value if the comparator input code is above the desired code value. These binary one or zero values are outputted in each clock cycle and applied to filter 234. The digital filter 234, in this embodiment, is an n bit shift register, e.g., 7 bits. At the time the clamp enable pulse goes low during a blanking period, i.e., disabling the clamp circuit correction mode, the shift register outputs a serial stream of code bits which are the last seven bits outputted by the comparator prior to the enable pulse going low. This action occurs once during each blanking period of the video signal.

The DAC 232 is a current source which outputs a current Io for each code word binary one inputted thereto and a current sink which outputs a current -Io for each code word binary zero inputted thereto. Depending on the value of the codes inputted to the DAC 232, it pumps charge into the filter 236 to move the positive input of the amplifier 220 up or down accordingly.

In the first embodiment described above, the different code words outputted by DAC 232 have different values in a given range so that the charge to the filter 236 may occur relatively rapidly to cause relatively large shifts in the analog voltage to ADC 206, as may be required during circuit start up. However, because the offsets of the circuit elements mainly change due to temperature shifts, they tend to shift relatively slowly. In the second embodiment, the ones and zeros outputted by the shift register of filter 234 each cause the DAC to generate the same fixed current amplitude for each binary digit value. What changes is the sequence of zeros and ones. For example, for relatively large shifts of voltage value, the filter 234 output may be all ones or all zeros. While the magnitude of the current for each binary unit remains the same, it is applied continuously as a charge current to the filter 236 effecting a relatively rapid change in correction to the analog voltage applied to the ADC 206. When the analog voltage is at the desired level, the filter 234 may contain sets of three ones and four zeros or vice versa dithering about the desired value due to the odd number of bits outputted by the shift register. This dithering action thus is confined to a one bit range. The resulting output currents of the DAC 232 thus are shifting in polarity over time. The comparator 226 by dithering about a transition value of the ADC 206 output can therefore maintain the voltage output on line 11 to a smaller range than that of the first embodiment. The second embodiment, while slower than the first embodiment, is simpler and less costly. In the present implementation, a slower system is acceptable because temperature shifts tend to also occur relatively slowly.

The output of amplifier 220 on line 240 when the clamp enable signal is present is an amplified current representing the difference between the filtered clamp voltage output of buffer 207 and the summed signal on line 222. This negative difference signal, however, exhibits an offset inserted by the amplifier 220 due to its input offset characteristics. The offset of this amplifier can exceed a level corresponding to ± one least significant bit for the ADC 206. It is significant and important that these offset errors of the amplifier 220 also be corrected. Further, any offsets of the DAC converter 232 may also be introduced into the analog signal on line 225. Therefore, a number of different sources of offset errors, including converters 206 and 232 and amplifier 220 may be manifested in the outputs of these different circuit elements.

These errors are all corrected by the comparator 226. These errors are all manifested cumulatively in the output of buffer 207 applied to converter 206. The output of ADC converter 206 which is the digitized signal on line 11 therefore manifests the cumulative errors of all of the circuit components in the clamp 10. This error signal is compared to the reference signal on line 228 and the resulting difference signal on 230 provides a correction signal to the reference mid level voltage on line 212 to produce a summed signal at adder 224. This summed signal has a value which represents the error difference between the signal on output line 11 and the desired output level represented by the code word on line 228. The differential amplifier 220 generates a charging current which is a negative of the difference between the error signal produced by comparator 226 and the output of buffer 207 applied to the inputs of amplifier 220. This charging current charges the clamping capacitor 202 in a direction to correct for that difference between the value of the signal on line 11 and the reference signal on line 228.

While this error signal may somewhat overshoot the desired reference signal, the resulting output signal on line 11 applied to the comparator 226 will then compensate for this by providing an error correction voltage in the opposite direction relative to the desired reference level. In this way the output of the differential amplifier 220 dithers the charge on the clamping capacitor 202 about the desired reference level within an acceptable range. The charging current may either be negative or positive at the output of the differential amplifier as applied to the capacitor 202 to effect either charging or discharging of the capacitor to the desired level. In this way, all circuit components introducing offset errors have no significance on the resulting output signal on output line 11 after the circuit settles.

A clamp enable signal is applied to line 240 which signal is applied to the differential amplifier 220, to the converter 232, filter 234 and the comparator 226. The clamp enable signal enables the clamp 10 to operate during the blanking portion of the video signal. For example, the clamp enable may operate only during a portion of the blanking signal. During this portion, the clamp capacitor is charged or discharged until the voltage there across manifests as close as possible as the circuit will permit the reference level represented by the digital code on line 228 applied to the comparator 226. During the active AC video portion of the composite video signal, the clamp enable signal is off. The clamp does not cause the charge on the capacitor 202 to change during this time. Therefore, the voltage on the clamp capacitor remains very near constant during the active AC portion of the video signal so as to maintain the integrity of the active video portion. During the next blanking interval, the clamping capacitor charge is once again corrected, if necessary, to approach the reference level on line 228. The clamping capacitor is charged only by relatively large currents and the video signal manifests relatively low currents so that effectively the voltage across the clamping capacitor remains constant during the active video portion of the processing. In other words, the clamp 10 effectively does not shift in clamping level during the active video portion of the signal.

What is claimed is:

1. A voltage clamping circuit for producing a digital signal having a given reference value comprising:

charge storage means for producing an analog output voltage indicative of a charge thereof;

charging means for producing a charge current for charging said charge storage means, said charging means including means responsive to said analog output voltage of said charge storage means and to a first voltage applied to said charging means to produce said charge current, said charge current being indicative of the relative values of said analog output voltage and said first voltage for changing the value of said analog output voltage according to said relative values, said charge current tending to exhibit a first offset value offset from said relative values whereby said analog output voltage is offset from said relative values;

analog-to-digital (A/D) conversion means for digitizing said analog output voltage into a digital output signal, said A/D conversion means tending to cause a further offset value in the value of said digital output signal whereby the digital output signal is offset from said given reference value; and voltage correction means responsive to said digital output signal for correcting the value of said first voltage to compensate for said first and further offset values such that the digital output signal substantially corresponds to the value of said given reference value.

2. A voltage clamping circuit as claimed in claim 1, wherein said voltage clamping circuit further comprises means for applying a video signal including a blanking portion to said charge storage means.

3. A voltage clamping circuit as claimed in claim 2, wherein said video signal comprises luminance components.

4. A voltage clamping circuit as claimed in claim 2, wherein said video signal comprises color difference components.

5. A voltage clamping circuit as claimed in claim 1, wherein said voltage correction means produces a correction voltage which is applied to said charging means as an input signal, and said charging means comprises means responsive to said correction voltage for providing one of a charge current and a discharge current to said charge storage means in accordance with the relative magnitudes of said analog output voltage and said correction voltage.

6. A voltage clamping circuit as claimed in claim 5, wherein said voltage correction means comprises means, responsive to said digital output signal and a reference voltage representing said given reference value, for supplying said correction voltage.

7. A voltage clamping circuit as claimed in claim 6, wherein said means for supplying said correction voltage comprises comparison means for generating a difference signal having a value which differs from said reference voltage in accordance with a cumulative magnitude of said first and further offset values, and means for adding said difference signal to a second reference signal to produce said correction voltage.

8. A voltage clamping circuit as claimed in claim 1, wherein said charging means includes a differential amplifier having an inverting input and a non-inverting input, said analog output voltage being applied to said inverting input, and said correction means includes means responsive to said digital output signal for supplying said correction signal and means for applying said correction signal correcting for said first and further offset values to said non-inverting input of said differential amplifier.

9. A voltage clamping circuit for clamping the output signal of an analog-to-digital converter to a reference value comprising:

an input for receiving an input signal;

a clamp capacitor coupled to said input;

an analog charge loop coupled to said clamp capacitor, said analog charge loop including a differential amplifier having an output for supplying an output current for charging said clamp capacitor, said differential amplifier having inverting and non-inverting inputs, said output current having a first offset value offset from a difference value of signals applied to said inverting and non-inverting inputs, said inverting input receiving an analog voltage corresponding to the charge on said clamp capacitor;

an analog-to-digital (A/D) converter for digitizing said analog voltage into a digital output signal, said A/D converter digital output signal tending to be offset from said reference value by a second offset value; and means responsive to said digital output signal for generating a correction signal and for applying the correction signal to said non-inverting input of said differential amplifier to correct for said first and second offset values such that said digital output signal is substantially at said reference value.

10. A voltage clamping circuit for clamping the output signal of an analog-to-digital (A/D) converter to a reference value comprising:

an input for receiving an input signal;

a clamp capacitor coupled to said input;

an analog charge loop coupled to said clamp capacitor, said analog charge loop including amplifier means having an output for supplying an output current for charging said clamp capacitor in accordance with relative values of first and second input signals applied to respective first and second input terminals of said amplifier means, said output current having a first offset value offset from the relative value of said first and second input signals, the first input signal comprising an analog voltage corresponding to the charge on said clamp capacitor;

an analog-to-digital (A/D) converter for digitizing said analog voltage into a digital output signal, said A/D converter digital output signal tending to be offset from said reference value by a second offset value; and correction means responsive to said digital output signal for generating a correction signal and for applying the correction signal as said second input signal to said second input terminal of said amplifier means to compensate for said first and second offsets values such that said digital output signal is substantially at said reference value.

11. A voltage clamping circuit as claimed in claim 10, wherein said amplifier means comprises a relatively high gain differential amplifier having inverting and non-inverting inputs, and said voltage clamping circuit further comprises low-pass filter means coupled between the clamp capacitor and the high gain differential amplifier, said low-pass filter means being coupled to said inverting input of said high gain differential amplifier, and wherein said correction means comprising means for supplying said A/D converter with a plurality of reference voltages, comparator means for comparing the digital output signal to a reference signal and for generating an error signal in response to said comparison, digital-to-analog (A/D) converter means for converting said error signal to an analog error signal, and means for summing said analog error signal to a selected one of said reference voltages thereby forming a summed signal and for applying said summed signal to said non-inverting input of said high gain differential amplifier.

12. A voltage clamping circuit as claimed in claim 10, wherein said voltage clamping circuit further includes clamp enable means for operating said voltage clamping circuit in a predetermined time interval.

13. A voltage clamping circuit as claimed in claim 10, wherein said voltage clamping circuit includes filter means coupled between said input and said clamp capacitor for receiving as said input signal a video signal having an active AC video portion and a blanking portion, said voltage clamping circuit having the function of shifting the value of said digital output signal at the output of said A/D converter to said reference value.

14. A voltage clamping circuit as claimed in claim 10, wherein said input signal comprises a video signal having an active AC video portion and a blanking portion, and said voltage clamping circuit further comprises digital video signal processing means for receiving said digital output signal of said A/D converter for digitally processing said active video portion and for inserting a digital blanking signal having a value corresponding to said reference value.

15. A voltage clamping circuit as claimed in claim 14, wherein said video signal includes luminance and color difference components, and said voltage clamping circuit further includes a plurality of said voltage clamping circuits, each of said plurality of said voltage clamping circuits being arranged to receive a different one of luminance and color difference components and being arranged to produce a digital output signal having a clamped value which corresponds to the blanking portion of that received component.

16. A clamping circuit for clamping a received signal to a given reference level, comprising:
means responsive to said received signal for generating a clamped digital output signal, including charge storage means to which said received signal is applied, and analog-to-digital converter means coupled to said charge storage means for generating said clamped digital output signal, said clamped digital output signal tending to be offset from said given reference level by an offset error in at least said analog-to-digital converter means;
error voltage generating means for generating an error correction voltage; and
means responsive to the correction voltage for correcting said clamped digital output signal to substantially correspond to said given reference level, wherein said error voltage generating means comprises comparator means responsive to said digital output signal and a digital reference signal representing said given reference level to provide a digital error signal corresponding to said error correction voltage, and said correcting means includes means responsive to said digital error signal for correcting the value of said clamped digital output signal, wherein said digital error signal comprises a binary signal having first and second values, one of said values corresponding to an error between said clamped digital output signal and said given reference level in a first direction relative to said given reference level, and the other of said values corresponding to an error in a second direction opposite the first direction, said error voltage generating means including means responsive to each of said binary signal values for generating a charge current having a given magnitude, said charge current having a first polarity corresponding to one of said binary signal values and a second opposite polarity corresponding to the other of said binary values, and further including charge means responsive to said charge currents for generating said error correction voltage.

17. A clamping circuit as claimed in claim 16, wherein said means responsive to said binary signal values for generating said charge current includes means for receiving said binary signal and for outputting a series of binary ones and zeroes each in accordance with the direction of said error, and digital-to-analog converter means responsive to said outputted binary ones and zeroes for providing a current sink in response to each of said binary one values and a current source in response to each of said binary zero values for respectively producing said charge currents of said first and second polarities.

18. A clamping circuit as claimed in claim 17, wherein said received signal is a video signal having an active AC portion and a blanking portion, said series of binary ones and zeros being outputted once during said blanking portion.

19. A clamping circuit as claimed in claim 18, wherein said series of binary ones and zeros comprises an odd number of such ones and zeros.

* * * * *